US010455679B2

(12) United States Patent
Saito et al.

(10) Patent No.: US 10,455,679 B2
(45) Date of Patent: Oct. 22, 2019

(54) EXTREME ULTRAVIOLET LIGHT GENERATION DEVICE

(71) Applicant: Gigaphoton Inc., Tochigi (JP)

(72) Inventors: Takashi Saito, Oyama (JP); Yoshifumi Ueno, Oyama (JP); Georg Soumagne, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/836,877

(22) Filed: Dec. 10, 2017

(65) Prior Publication Data

US 2018/0103534 A1 Apr. 12, 2018

Related U.S. Application Data

(63) Continuation of application No. PCT/JP2015/071619, filed on Jul. 30, 2015.

(51) Int. Cl.
*H05G 2/00* (2006.01)
*G03F 7/00* (2006.01)

(52) U.S. Cl.
CPC ............ *H05G 2/006* (2013.01); *H05G 2/008* (2013.01)

(58) Field of Classification Search
CPC ........ H05G 2/008; H05G 2/003; H05G 2/005; H05G 2/006; H05G 2/00; H05G 2/001; G03F 7/70033; G03F 7/70916; G03F 7/70175; G03F 7/70575; G03F 7/70808; G03F 7/7085; G03F 7/70941; G03F 7/7095
USPC ............ 250/504 R, 493.1, 423 R, 424, 425, 250/492.1, 503.1, 505.1
See application file for complete search history.

(56) References Cited

U.S. PATENT DOCUMENTS 8,507,883 B2 * 8/2013 Endo ...................... H05G 2/008 250/423 R
2004/0105095 A1 * 6/2004 Stobrawa ............... H05G 2/003 356/318

(Continued)

FOREIGN PATENT DOCUMENTS

JP 2007-200615 A 8/2007
JP 2013-135033 A 7/2013

(Continued)

OTHER PUBLICATIONS

International Search Report issued in PCT/JP2015/071619; dated Oct. 20, 2015.

(Continued)

*Primary Examiner* — David A Vanore
(74) *Attorney, Agent, or Firm* — Studebaker & Brackett PC

(57) ABSTRACT

The extreme ultraviolet light generation device includes a chamber having a first through-hole that allows a pulse laser beam to enter the chamber, a target supply unit held by the chamber and configured to output a target toward a predetermined region in the chamber, a shield member surrounding the predetermined region in the chamber and having a target path that allows the target outputted from the target supply unit to pass toward the predetermined region, and a tubular member surrounding at least a part of an upstream portion of the trajectory of the target outputted from the target supply unit toward the predetermined region, the upstream portion being upstream from the target path of the shield member.

11 Claims, 11 Drawing Sheets

(56) References Cited

U.S. PATENT DOCUMENTS

| | | | | |
|---|---|---|---|---|
| 2005/0269529 | A1* | 12/2005 | Ershov | B82Y 10/00 250/504 R |
| 2006/0186356 | A1* | 8/2006 | Imai | B82Y 10/00 250/504 R |
| 2007/0170377 | A1* | 7/2007 | Nakano | H05G 2/003 250/504 R |
| 2007/0228298 | A1* | 10/2007 | Komori | H05G 2/003 250/493.1 |
| 2009/0230326 | A1 | 9/2009 | Vaschenko et al. | |
| 2009/0272919 | A1* | 11/2009 | Abe | G03F 7/70033 250/504 R |
| 2009/0289205 | A1* | 11/2009 | Moriya | G02B 5/0891 250/504 R |
| 2010/0025223 | A1* | 2/2010 | Yanagida | H05G 2/003 204/157.15 |
| 2010/0078580 | A1* | 4/2010 | Endo | H05G 2/003 250/504 R |
| 2012/0217422 | A1* | 8/2012 | Yabu | H05G 2/006 250/504 R |
| 2013/0048878 | A1* | 2/2013 | Mizoguchi | H05G 2/005 250/492.1 |
| 2013/0161540 | A1 | 6/2013 | Nagai et al. | |
| 2013/0228709 | A1 | 9/2013 | Umeda et al. | |
| 2013/0234597 | A1* | 9/2013 | Kusunose | H01J 1/52 315/111.21 |
| 2014/0217311 | A1* | 8/2014 | Nishisaka | H05G 2/003 250/504 R |
| 2014/0319387 | A1* | 10/2014 | Kim | H05G 2/006 250/504 R |
| 2016/0227638 | A1* | 8/2016 | Hori | H05G 2/005 |
| 2017/0215267 | A1* | 7/2017 | Abe | H05G 2/006 |
| 2018/0103534 | A1* | 4/2018 | Saito | H05G 2/00 |

FOREIGN PATENT DOCUMENTS

| | | | | |
|---|---|---|---|---|
| JP | 2013-182864 A | 9/2013 | | |
| WO | WO-2015068230 A1 * | 5/2015 | | H05G 2/005 |
| WO | 2015/086510 A1 | 6/2015 | | |

OTHER PUBLICATIONS

International Preliminary Report on Patentability issued in PCT/JP2015/071619; dated Jan. 30, 2018.

An Office Action mailed by the Japanese Patent Office dated Feb. 26, 2019, which corresponds to Japanese Patent Application No. 2017-530560 and is related to U.S. Appl. No. 15/836,877; with English translation.

* cited by examiner

EXTREME ULTRAVIOLET LIGHT GENERATION DEVICE

TECHNICAL FIELD

The present disclosure relates to an extreme ultraviolet light generation device.

BACKGROUND ART

In recent years, as semiconductor processes become finer, transfer patterns for use in photolithography of semiconductor processes have rapidly become finer. In the next generation, micro-fabrication at 70 nm to 45 nm, and further, micro-fabrication at 32 nm or less would be demanded. In order to meet the demand for, for example, micro-fabrication at 32 nm or less, it is expected to develop an exposure apparatus in which a system for generating extreme ultraviolet (EUV) light at a wavelength of approximately 13 nm is combined with a reduced projection reflective optical system.

Three types of EUV light generation systems have been proposed, which include an LPP (laser produced plasma) type system using plasma generated by irradiating target material with a pulse laser beam, a DPP (discharge produced plasma) type system using plasma generated by an electric discharge, and an SR (synchrotron radiation) type system using synchrotron radiation.

Patent Document 1: US Patent Application Publication No. 2014/0319387 A

Patent Document 2: US Patent Application Publication No. 2009/0230326 A

Patent Document 3: US Patent Application Publication No. 2012/0217422 A

SUMMARY

An extreme ultraviolet light generation device according to an aspect of the present disclosure may include a chamber having a first through-hole that allows a pulse laser beam to enter the chamber, a target supply unit held by the chamber and configured to output a target toward a predetermined region in the chamber, a shield member surrounding the predetermined region in the chamber and having a target path that allows the target outputted from the target supply unit to pass toward the predetermined region, and a tubular member surrounding at least a part of an upstream portion of the trajectory of the target outputted from the target supply unit toward the predetermined region, the upstream portion being upstream from the target path of the shield member.

BRIEF DESCRIPTION OF DRAWINGS

Exemplary embodiments of the present disclosure will be described below as mere examples with reference to the appended drawings.

DESCRIPTION OF EMBODIMENTS

Contents

1. General. Description of an Extreme Ultraviolet Light Generation System
 1.1 Configuration
 1.2 Operation
2. Description of Terms
3. EUV Light Generation Device of Comparative Example
 3.1 Configuration
 3.2 Operation
 3.3 Problem
4. EUV Light Generation Device Including Tubular Member
 4.1 Configuration and Operation
 4.2 Effect
5. EUV Light Generation Device Including Moving Mechanism of Target Supply Unit
6. EUV Light Generation Device Where Tubular Member is Fixed to Target Supply Unit
7. EUV Light Generation Device Where Purge Gas is Supplied to Inside of Tubular Member
8. EUV Light Generation Device Where Etching Gas is Supplied to Inside of Tubular Member Embodiments of the present disclosure will be described in detail below with reference to the drawings. The embodiments described below indicate several examples of the present disclosure, and may not intend to limit the content of the present disclosure. Not all of the configurations and operations described in the embodiments are indispensable in the present disclosure. Identical reference symbols may be assigned to identical constituent elements and redundant descriptions thereof may be omitted.

Figure 1:
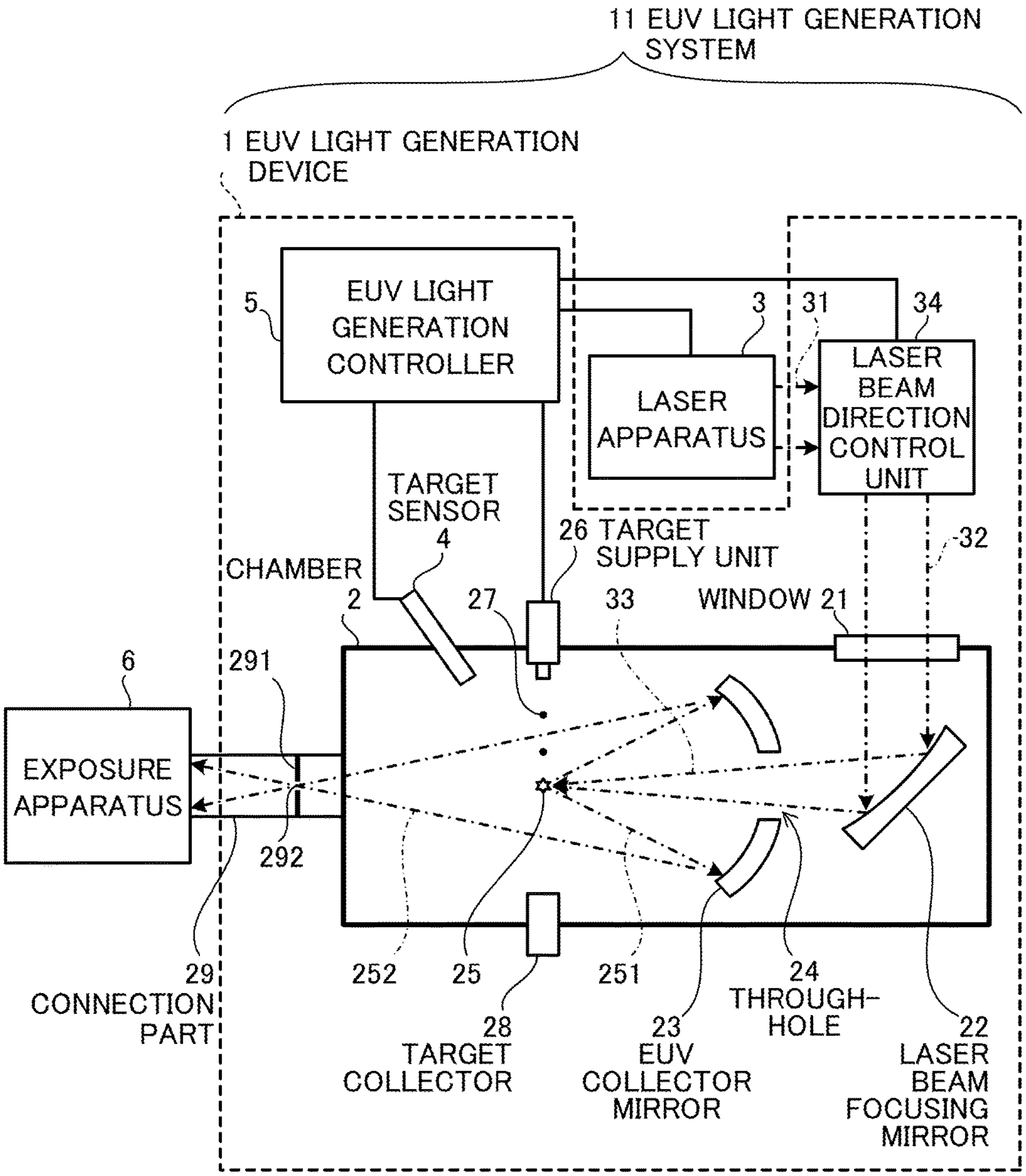
FIG. 1 schematically shows an exemplary configuration of an LPP type EUV light generation system.

1. General Description of an Extreme Ultraviolet Light Generation System 1.1 Configuration FIG. 1 schematically shows an exemplary configuration of an LPP type EUV light generation system. An EUV light generation device 1 may be used with at least one laser apparatus 3. In the present disclosure, a system that includes the EUV light generation device 1 and the laser apparatus 3 may be referred to as an EUV light generation system 11. As shown in FIG. 1 and described in detail below, the EUV light generation device 1 may include a chamber 2 and a target supply unit 26. The chamber 2 may be sealed airtight. The target supply unit 26 may be mounted on the chamber 2, for example, to penetrate a wall of the chamber 2. A target material to be supplied by the target supply unit 26 may include, but is not limited to, tin, terbium, gadolinium, lithium, or a combination of any two or more of them.

The chamber 2 may have at least one through-hole formed in its wall. A window 21 may be located at the through-hole. A pulse laser beam 32 outputted from the laser apparatus 3 may travel through the window 21. In the chamber 2, an EUV collector mirror 23 having a spheroidal reflective surface, for example, may be provided. The EUV collector mirror 23 may have a first focusing point and a second focusing point. The surface of the EUV collector mirror 23 may have, for example, a multi-layered reflective film in which molybdenum layers and silicon layers are alternately laminated. The EUV collector mirror 23 is preferably positioned such that the first focusing point is positioned in a plasma generation region 25 and the second focusing point is positioned in an intermediate focus (IF) region 292. The EUV collector mirror 23 may have a through-hole 24 formed at the center thereof, and a pulse laser beam 33 may travel through the through-hole 24.

The EUV light generation device 1 may further include an EDIT light generation controller 5 and a target sensor 4. The target sensor 4 may have an imaging function and detect the presence, actual path, position, speed, and the like of a target 27.

Furthermore, the EUV light generation device 1 may include a connection part 29 for allowing the interior of the chamber 2 to be in communication with the interior of an exposure apparatus 5. In the connection part 29, a wall 291 formed with an aperture may be provided. The wall 291 may be positioned such that the second focusing point of the EUV collector mirror 23 lies in the aperture formed in the wall 291.

Furthermore, the EUV light generation device 1 may also include a laser beam direction control unit 34, a laser beam focusing mirror 22, a target collector 28 for collecting the target 27, and the like. The laser beam direction control unit 34 may include an optical system for defining the traveling direction of the pulse laser beam and an actuator for adjusting the position, the posture, or the like of the optical system.

1.2 Operation

With continued reference to FIG. 1, a pulse laser beam 31 outputted from the laser apparatus 3 may pass through the laser beam direction control unit 34 and be outputted therefrom as the pulse laser beam 32. The pulse laser beam 32 may travel through the window 21 and enter the chamber 2. The pulse laser beam 32 may travel inside the chamber 2 along at least one laser optical path, be reflected by the laser beam focusing mirror 22, and strike the target 27 as the pulse laser beam 33.

The target supply unit 26 may be configured to output the target 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 may be emitted from the plasma. EUV light included in the light 251 may be reflected by the EUV collector mirror 23 at higher reflectance than light in other wavelength region. Reflected light 252 including the EUV light reflected by the EUV collector mirror 23 may be focused in the intermediate focus region 292 and outputted to the exposure apparatus 6.

The EUV light generation controller 5 may be configured to integrally control the EUV light generation system 11. The EUV light generation controller 5 may be configured to process, for example, image data of the target 27 as captured by the target sensor 4. Further, the EUV light generation controller 5 may be configured to control the timing when the target 27 is outputted, the direction in which the target 27 is outputted, and the like. Furthermore, the EUV light generation controller 5 may, for example, be configured to control the timing when the laser apparatus 3 oscillates, the traveling direction in which the pulse laser beam 32 travels, the position at which the pulse laser beam 33 is focused, and the like. The various controls mentioned above are merely examples, and other controls may be added as necessary.

2. Description of Terms

"A trajectory" of a target refers to an ideal path of the target outputted from a target supply unit, or a path of the target according to a design of the target supply unit.

"An actual path" of a target refers to an actual path of the target outputted from the target supply unit.

"A plasma generation region" refers to a region where generation of plasma starts by irradiating the target with a pulse laser beam. The plasma generation region may correspond to a predetermined region in the present disclosure.

3. EUV Light Generation Device of Comparative Example 3.1 Configuration

Figure 2:
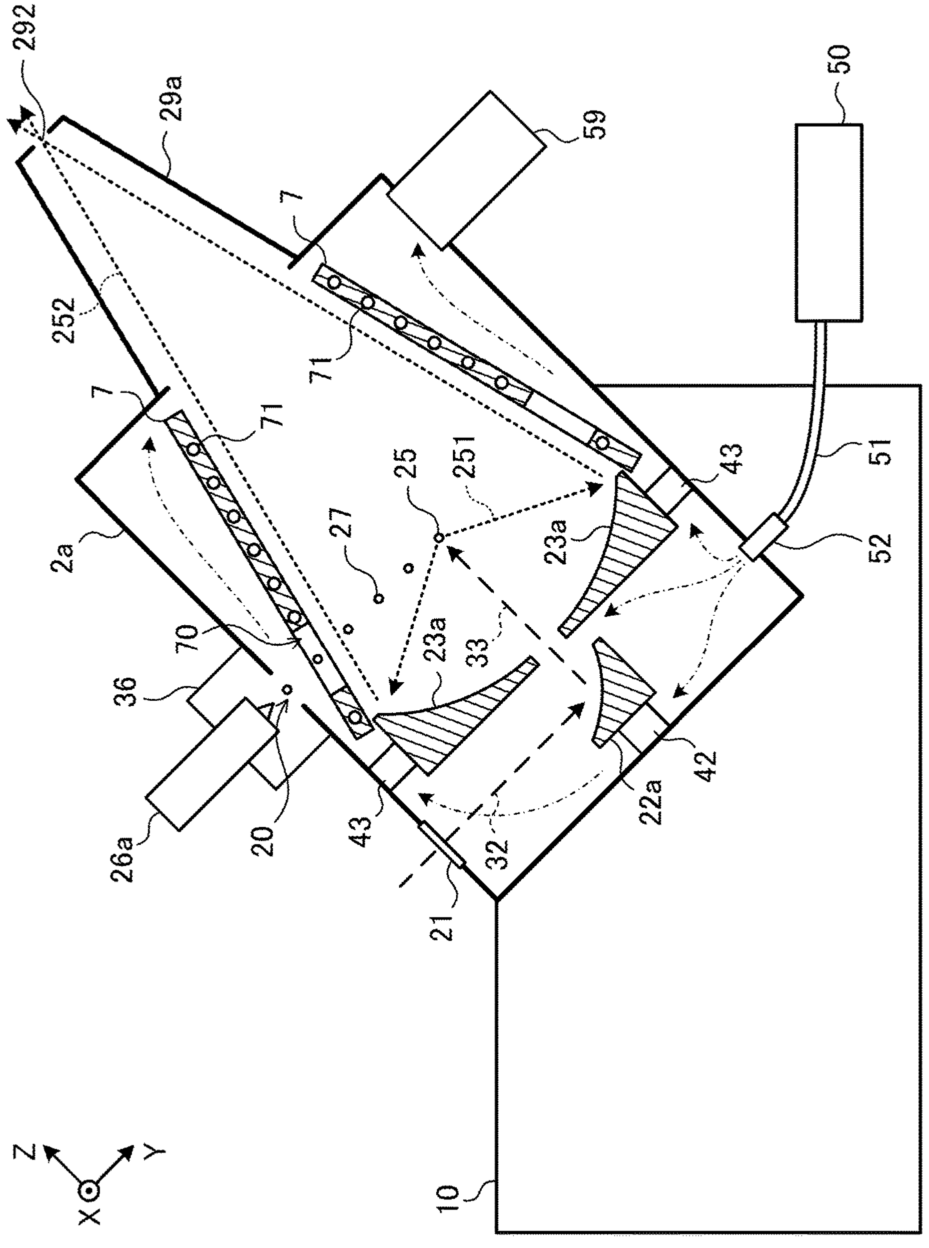
FIG. 2 schematically shows a configuration of the EUV light generation device according to a comparative example of the present disclosure.

FIG. 2 schematically shows a configuration of the EUV light generation device according to a comparative example of the present disclosure. As shown in FIG. 2, a chamber **2*a* may be held by a chamber holding member 10 at a posture inclined against the direction of gravity. As shown in FIG. 2, an output direction of the EUV light may be a Z direction. An output direction of the target may be a Y direction. The direction perpendicular to both the Z direction and the Y direction may be an X direction. A holding unit 36, an etching gas supply device 50, an exhaust device 59, and a connecting portion 29*a* may be provided at the outside of the chamber 2*a***.

A target supply unit **26*a* may be attached via the holding unit 36 to the chamber 2*a*. The chamber 2 may have a through-hole 20. The holding unit 36 may be detachably attached at the outside of the chamber 2*a* to cover the through-hole 20**.

The etching gas supply device 50 may include an unillustrated gas cylinder containing etching gas and an unillustrated mass flow controller or on-off valve. The etching gas may include a gas capable of etching the target material adhered on a surface of an EUV collector mirror **23*a*. The etching gas may include hydrogen. The etching gas supply device 50 may be connected to a pipe 51. The pipe 51 may be connected to a connecting port 52, and the connecting port 52 may be connected to the chamber 2*a***.

The exhaust device 59 may include an exhaust pump. The exhaust device 59 may be connected to the chamber **2*a* at a position distanced from the connecting port 52**.

The EUV collector mirror **23*a*, a laser beam focusing optical system 22*a*, and a shield member 7 may be provided in the chamber 2*a***.

The EUV collector mirror **23*a* may be fixed via EUV collector mirror holders 43 to the chamber 2*a*. The laser beam focusing optical system 22*a* may be supported by a holder 42 in the chamber 2*a*. The laser beam focusing optical system 22*a* may be configured by an off-axis paraboloidal mirror. The focusing point of the off-axis paraboloidal mirror may be in the plasma generation region 25**.

The shield member 7 may have a tapered cylindrical shape having a large diameter at a first end in the direction, and a small diameter at a second end in the +Z direction. The shield member 7 may surround the plasma generation region 25. Further, the shield member 7 may surround an optical path of the reflected light 252 including the EUV light reflected by the EUV collector mirror 23*a*. The first end in the −Z direction of the shield member 7 may be located adjacent to an outer edge of the EUV collector mirror 23*a*. The second end in the +Z direction of the shield member 7 may be located downstream in the optical path of the reflected light 252 including the EUV light reflected by the EUV collector mirror 23*a*.

The shield member 7 may have a through-hole 70. The through-hole 70 may be located on a trajectory of the target 27 between the target supply unit 26*a* and the plasma generation region 25. The through-hole 70 may constitute a target path to pass the target 27 outputted from the target supply unit 26*a* toward the plasma generation region 25.

The shield member 7 may have a flow path 71 to pass liquid coolant. The coolant may be water. The flow path 71 may be connected to an unillustrated pump and an unillustrated heat exchanger.

3.2 Operation

The etching gas supply device 50 may supply the etching gas to the chamber 2*a*. The exhaust device 59 may exhaust gas in the chamber 2*a* such that the pressure in the chamber 2*a* becomes a predetermined pressure that is lower than the atmospheric pressure. Gas flow, from the connecting port 52 for supplying the etching gas to the chamber 2*a* to the exhaust device 59 for exhausting gas from the chamber 2*a*, may thus be generated in the chamber 2*a*. The gas flow generated in the chamber 2*a* may include unillustrated gas flow inside the shield member 7 and gas flow outside the shield member 7 as shown by arrows with alternate long and short dash lines in FIG. 2.

The target 27 outputted from the target supply unit 25*a* may pass through the through-hole 20 of the chamber 2*a* and the through-hole 70 of the shield member 7 to reach the plasma generation region 25. The pulse laser beam 32 may enter the chamber 2*a* via the window 21 and be incident on the laser beam focusing optical system 22*a*. The pulse laser beam 33 reflected by the laser beam focusing optical system 22*a* may be collected at the plasma generation region 25. The pulse laser beam 33 may reach the plasma generation region 25 at the timing when the target 27 reaches the plasma generation region 25.

The target 27 may be turned into plasma by being irradiated with the pulse laser beam 33. The plasma may radiate the light 251. The plasma, having high temperature, may heat the chamber 2*a*. To suppress temperature and deformation of the chamber 2*a*, the shield member 7 may absorb radiant heat from the plasma. Further, the plasma, having high temperature, may further generate gas flow in the chamber 2*a*. At the timing immediately after starting generation of the EUV light, or the timing immediately after restarting generation of the EUV light after suspension of generating the EUV light for a predetermined period of time, temperature in the chamber 2*a* may rapidly change. At this timing, direction and flow rate of the gas flow may fluctuate in a short time and the gas flow may be complicated.

3.3 Problem

Figure 3:
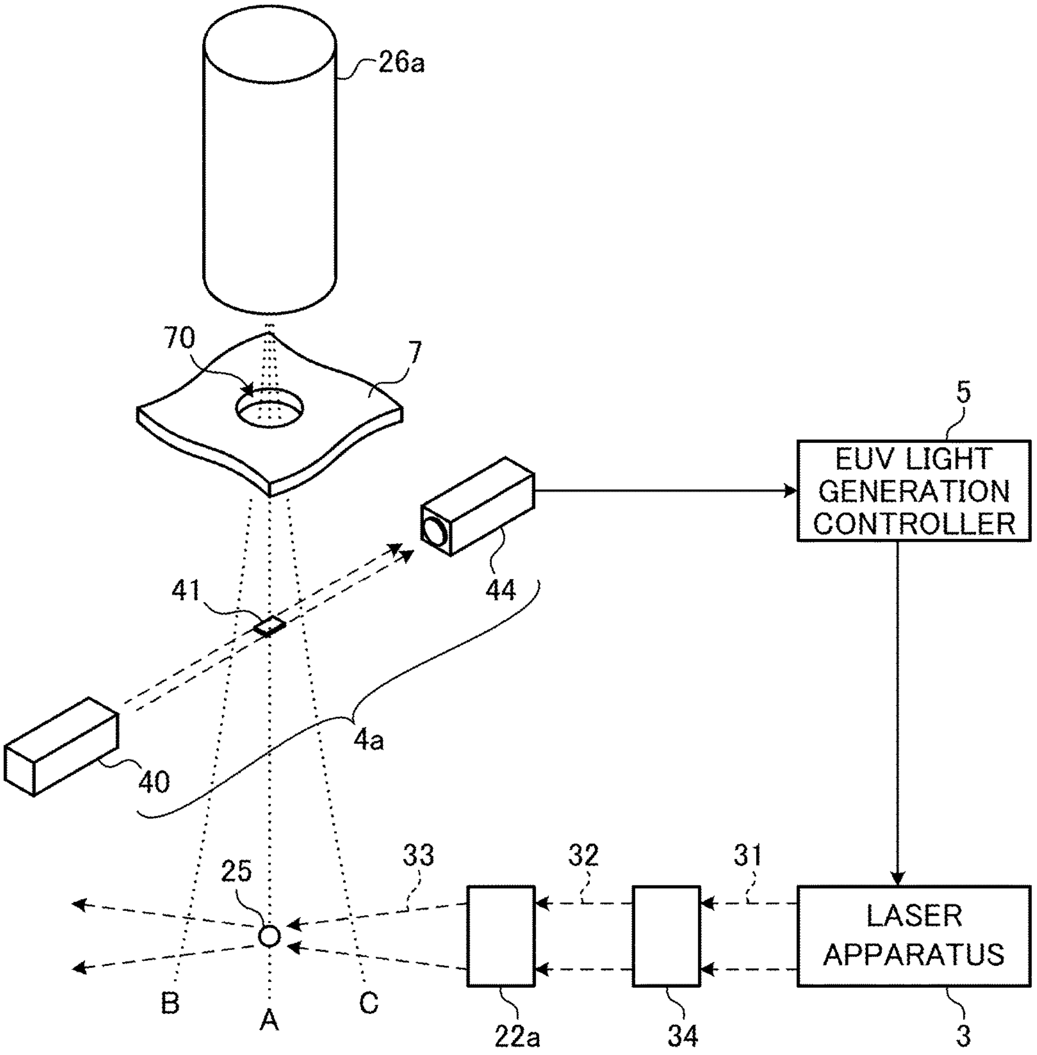
FIG. 3 is a magnified perspective view of a trajectory of a target shown in FIG. 2.

FIG. 3 is a magnified perspective view of the trajectory of the target shown in FIG. 2. The trajectory "A" of the target between the target supply unit 26*a* and the plasma generation region 25 may pass through the through-hole 70 of the shield member 7 and a detecting region 41 of a target sensor 4*a*. The target sensor 4*a* may include an illuminating device 40 and a light-receiving device 44. The illuminating device 40 may be in a position to illuminate the detecting region 41. The light-receiving device 44 may be in a position to receive the light that has been outputted from the illuminating device 40 and has passed through the detecting region 41.

When the target passes through the detecting region 41, a part of the light outputted from the illuminating device 40 may be blocked by the target. The light-receiving device 44 may send a signal representing change in intensity of the received light to the EUV light generation controller 5 to show the timing at which the target passes. The EUV light generation controller 5 may output a laser trigger signal based on the signal sent by the light-receiving device 44. The laser trigger signal may be a signal with a predetermined delay time from the signal showing the timing at which the target passes. The laser apparatus 3 may output the pulse laser beans 31 based on the laser trigger signal. Output timing of the pulse laser beam 31 may thus be controlled, which may allow the pulse laser beam 33 to reach the plasma generation region 25 at the timing when the target reaches the plasma generation region 25.

In the case where the complicated gas flow is generated in the chamber 2*a* due to the plasma having the high temperature as described above, the target outputted from the target supply unit 26*a* may be pushed by the gas flow and the actual path of the target may be changed as shown by "B" or "C" in FIG. 3. Change in the actual path is desirably within an acceptable range. However, there may be a case where the actual path goes beyond the acceptable range and, for example, the target does not pass through the detecting region 41 of the target sensor 4*a*. In that case, the target may not be detected, which may cause the laser trigger signal and the pulse laser beam to fail to be outputted. The EUV light may thus fail to be generated.

Even if the target passes the detecting region 41 of the target sensor 4*a*, there may be a case where the target does not pass through the plasma generation region 25. In that case, although the pulse laser beam is outputted, the target may not be irradiated or too small portion of the target may be irradiated with the pulse laser beam. The EUV light may thus fail to be generated, or have low energy.

In the embodiments described below, fluctuation of the actual path of the target may be suppressed to stabilize EUV light generation.

Figure 4:
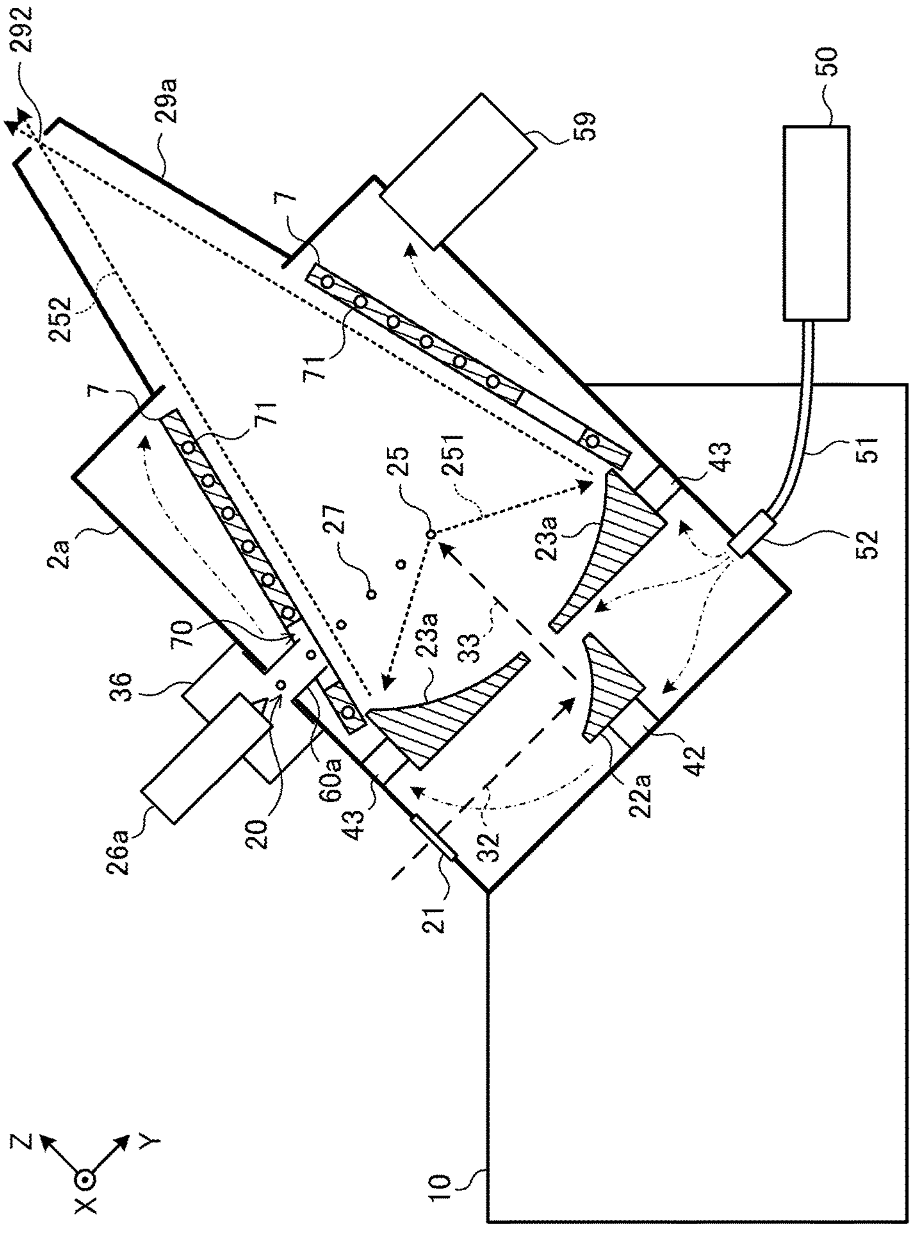
FIG. 4 schematically shows a configuration of an EUV light generation device according to a first embodiment of the present disclosure.

4. EUV Light Generation Device Including Tubular Member 4.1 Configuration and Operation FIG. 4 schematically shows a configuration of an EUV light generation device according to a first embodiment of the present disclosure. As shown in FIG. 4, a tubular member 60*a* may surround at least a part of an upstream portion of the trajectory of the target from the target supply unit 26*a* to the plasma generation region 25. The upstream portion may be upstream from the through-hole 70 of the shield member 7. A first end of the tubular member 60*a* may be fixed to a periphery of the through-hole 20 of the chamber 2*a*. A second end of the tubular member 60*a* may be located in the vicinity of the through-hole 70 of the shield member 7. The tubular member 60*a* and the shield member 7 may have a gap between them.

The second end of the tubular member 60*a* described above may further be inserted in the through-hole 70 of the shield member 7. The tubular member 60*a* may penetrate the through-hole 70 of the shield member 7, while illustration is omitted, and the second end of the tubular member 60*a* described above may be located inside the shield member 7. The tubular member 60*a* may preferably be, however, located at the outside of the optical path of the reflected light 252 including the EUV light reflected by the EUV collector mirror 23*a*.

In the configuration described above, the target 27 outputted from the target supply unit 26*a* may pass through the tubular member 60*a*, The target 27 having passed through the tubular member 60*a* may reach the plasma generation region 25.

Figure 5A:
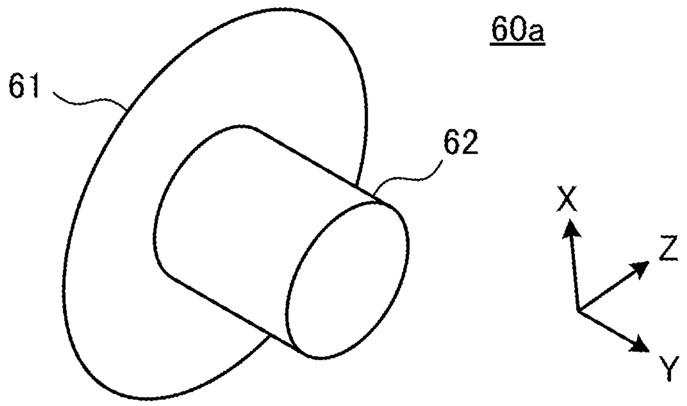
FIG. 5A is a perspective view of a first example of a shape of a tubular member.

FIG. 5A is a perspective view of a first example of a shape of the tubular member 60*a*. A body portion 62 of the tubular member 60*a* may have a cylindrical shape. Namely, the body portion 62 of the tubular member 60*a* may have a circular section substantially perpendicular to the Y direction.

The first end of the tubular member 60*a* described above may have a flange portion 61 for fixing the tubular member 60*a* to the chamber 2*a*. The flange portion 61 may be located at the outside of the chamber 2*a* as shown in FIG. 4. The second end of the tubular member 60*a* described above may be located in the chamber 2*a*. The tubular member 60*a* may be installed by being inserted from the outside of the chamber 2*a* to the through-hole 20 of the chamber 2*a* and fixing the flange portion 61 to the chamber 2*a* with unillustrated bolts. To remove the tubular member 60*a* for replacing the tubular member 60*a*, the bolts described above may be removed and the tubular member 60*a* may be drawn from the through-hole 20 to the outside of the chamber 2*a*.

Figure 5B:
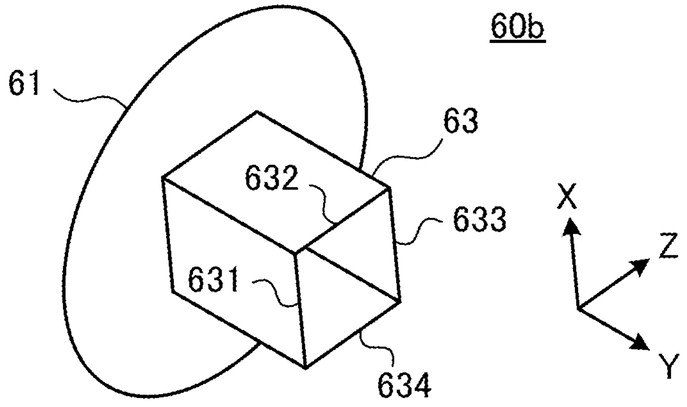
FIG. 5B is a perspective view of a second example of the shape of a tubular member.

FIG. 5B is a perspective view of a second example of a shape of a tubular member 60*b*. A body portion 63 of the tubular member 60*b* may have a quadrangle piped shape. The body portion 63 of the tubular member 60*b* may have a quadrangle section substantially perpendicular to the Y direction. The section of the body portion 63 of the tubular member 60*b* may have a rectangular shape. The section of the body portion 63 of the tubular member 60*b* may have a square shape. The flange portion 61 may be substantially the same as that in the first example described above.

The section of the tubular member may not be limited to circular or quadrangular, and may have another shape.

4.2 Effect

According to the first embodiment, the target 27 outputted from the target supply unit 26*a* may pass through the tubular member 60*a* or 60*b* without being exposed to the gas flow inside the chamber 2*a* and outside the shield member 7. Accordingly, the actual path of the target 27 may be suppressed to fluctuate due to the change of the gas flow in the chamber 2*a*.

Figure 6:
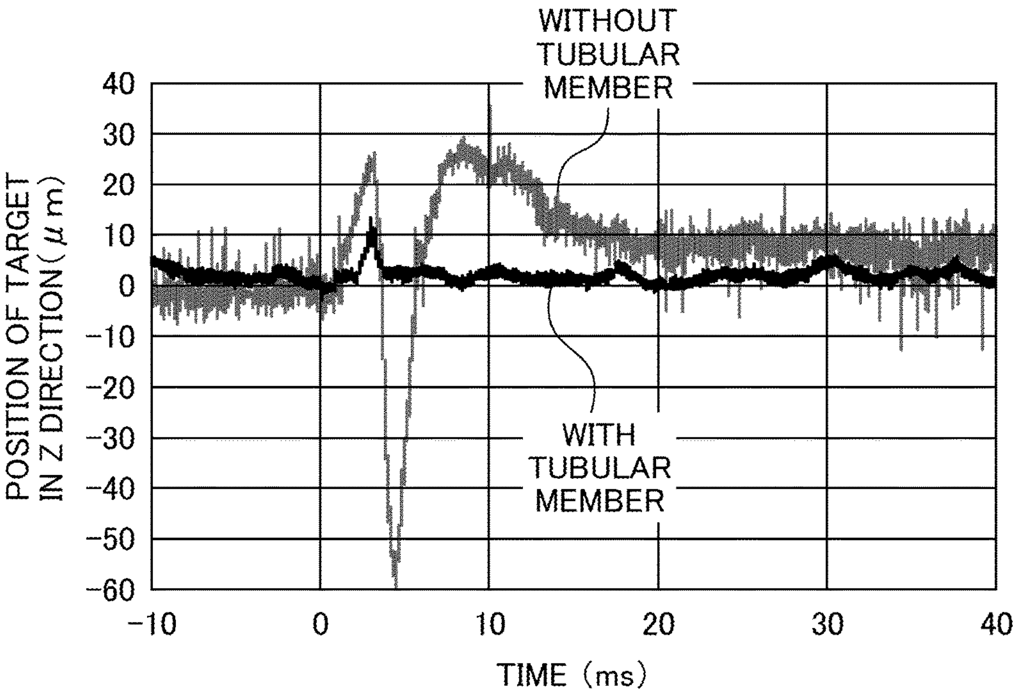
FIG. 6 is a graph comparing changes of an actual path of the target in the comparative example shown in FIG. 2 and an actual path of the target in the first embodiment shown in FIG. 4.

FIG. 6 is a graph comparing changes of an actual path of the target in the comparative example shown in FIG. 2 and an actual path of the target in the first embodiment shown in FIG. 4. The vertical axis in FIG. 6 represents a shift amount of the position of the target 27 in the Z direction from a targeted position of the target 27 in the vicinity of the plasma generation region 25. A positive value in the vertical axis represents a situation where the target has shifted to the +Z direction. A negative value in the vertical axis represents a situation where the target 27 has shifted in the −Z direction. The horizontal axis in FIG. 6 represents elapsed time. A negative value in the horizontal axis represents a situation where the EUV light generation has not started. A positive value in the horizontal axis represents a situation where the EUV light generation has started. The larger the value in the horizontal axis is, the longer the period from starting generation of the EUV light is.

As shown in FIG. 6, in the comparative example without the tubular member, the actual path of the target immediately after starting generation of the EUV light may be unstable, shifting in the +Z direction or the −Z direction. The direction in which the actual path shifts may thus not be constant and may change between the +Z direction and the −Z direction. This may suggest that the gas flow in the chamber 2*a* does not have a constant direction, and the direction and the flow rate of the gas flow immediately after starting generation of the EUV light may complicatedly change. When some time has passed after starting generation of the EUV light, the gas flow in the chamber 2*a* in the comparative example may be stabilized and the actual path of the target may be stabilized.

In the first embodiment having the tubular member, as shown in FIG. 6, the actual path of the target may be substantially stable. Even immediately after starting generation of the EUV light, fluctuation of the actual path of the target may be suppressed. Even if the direction of the gas flow in the chamber 2*a* is not constant and the direction and the flow rate of the gas flow immediately after starting generation of the EUV light complicatedly changes, the tubular member 60*a* or 60*b* may suppress the fluctuation of the actual path of the target. Further, the tubular member 60*a* or 60*b* may not necessarily cover the whole trajectory of the target to the plasma generation region 25. The tubular member 60*a* or 60*b* covering the part of the trajectory of the target at the outside of the shield member 7 may be significantly effective.

In the present disclosure, covering the trajectory of the target may preferably mean that the tubular member covers all around the periphery of the trajectory of the target. However, covering the trajectory of the target may not necessarily mean that the tubular member must not have any slit or cut. A substantially tubular member that may suppress the fluctuation of the gas flow in the trajectory of the target may be used even if it has any slit or cut.

5. EUV Light Generation Device Including Moving Mechanism of Target Supply Unit

Figure 7:
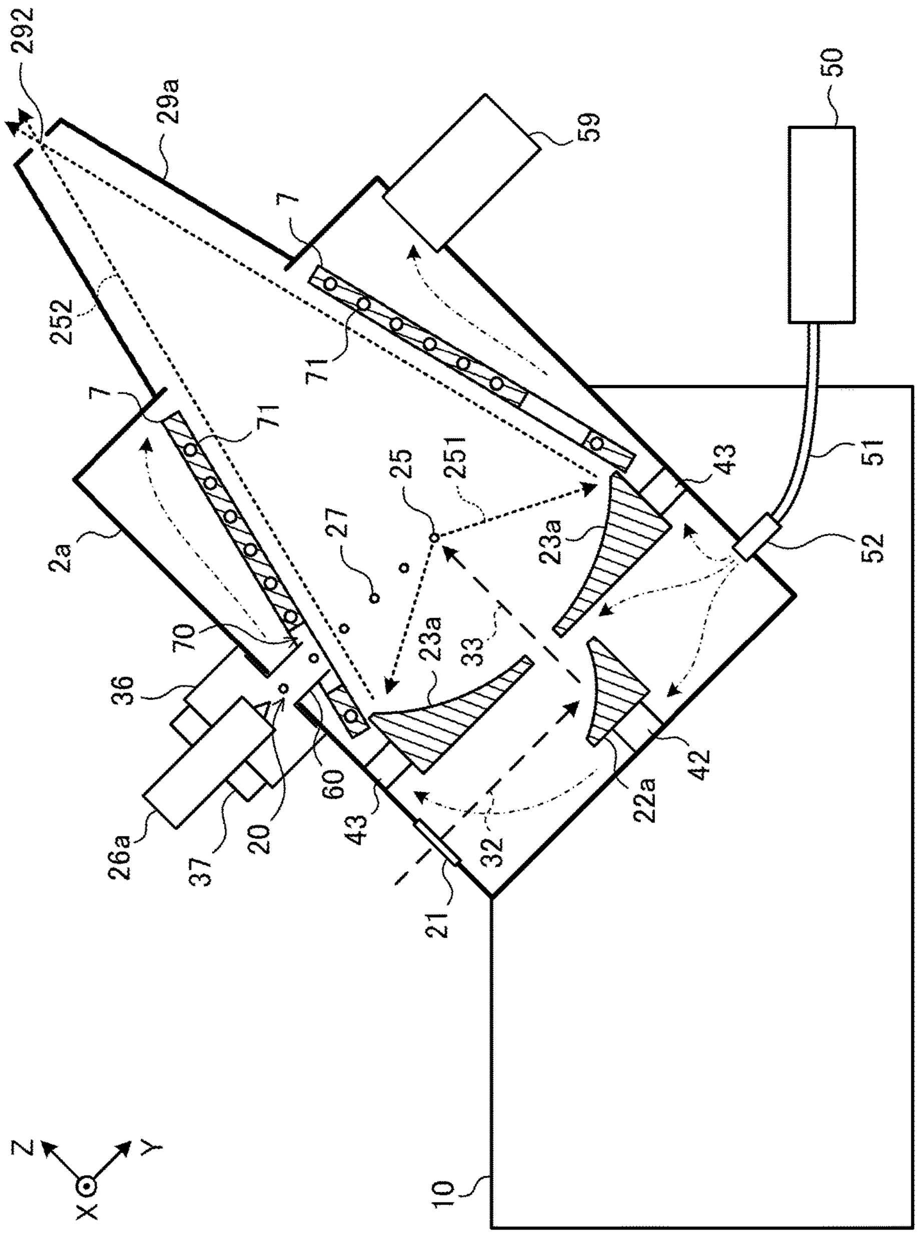
FIG. 7 schematically shows a configuration of an EUV light generation device according to a second embodiment of the present disclosure.

FIG. 7 schematically shows a configuration of an EUV light generation device according to a second embodiment of the present disclosure. As shown in FIG. 7, the target supply unit 26*a* may be held via an XZ stage 37 by the holding unit 36. The target sensor 4*a*, which is not shown in FIG. 7, may be configured to detect the actual path of the target. The XZ stage 37 may be capable of moving the target supply unit 2*a* in the X direction and the direction. Moving the target supply unit 26*a* by the XZ stage 37 may change the trajectory of the target. The XZ stage 37 may correspond to the trajectory adjusting mechanism in the present disclosure.

The EUV light generation controller 5 described above with reference to FIG. 1 may perform feedback control of the XZ stage 37, based on the actual path of the target detected by the target sensor 4*a*, such that the actual path of the target is settled in a desired range. However, the driving frequency of the XZ stage 37 may not be sufficient to follow the rapid fluctuation of the actual path of the target described above with reference to FIG. 6. Thus, the XZ stage 37 may change the trajectory of the target such that the actual path of the target is settled in a targeted range in a time period longer than that shown in FIG. 6.

A tubular member 60 used in the second embodiment may have the cylindrical shape described above with reference to FIG. 5A.

Alternatively, the tubular member 60 used in the second embodiment may have the quadrangle piped shape described above with reference to FIG. 53. In the second embodiment, the quadrangle piped tubular member 60*b* may have a rectangular section including a first side 631 and a third side 633 substantially parallel to the X direction, and a second side 632 and a fourth side 634 substantially parallel to the Z direction. A region where the target supply unit 26*a* may be moved by the XZ stage 37 and the section of the tubular member 60*b* may thus have similar shapes.

The region where the target supply unit 26*a* may be moved by the XZ stage 37 may be slightly smaller than the section of the tubular member 60*b*. For example, if the region where the target supply unit 26*a* may be moved by the XZ stage 37 has a length of 20 mm in the X direction and 20 mm in the Z direction, the section of the tubular member 60*b* may have a square shape having a length of 21 mm in the X direction and 21 mm in the Z direction. If the XZ stage 37 moves the target supply unit 26*a* in the region described above, the target may be suppressed to hit the tubular member 60*b*.

In other aspects, the second embodiment may be substantially the same as the first embodiment.

Figure 8:
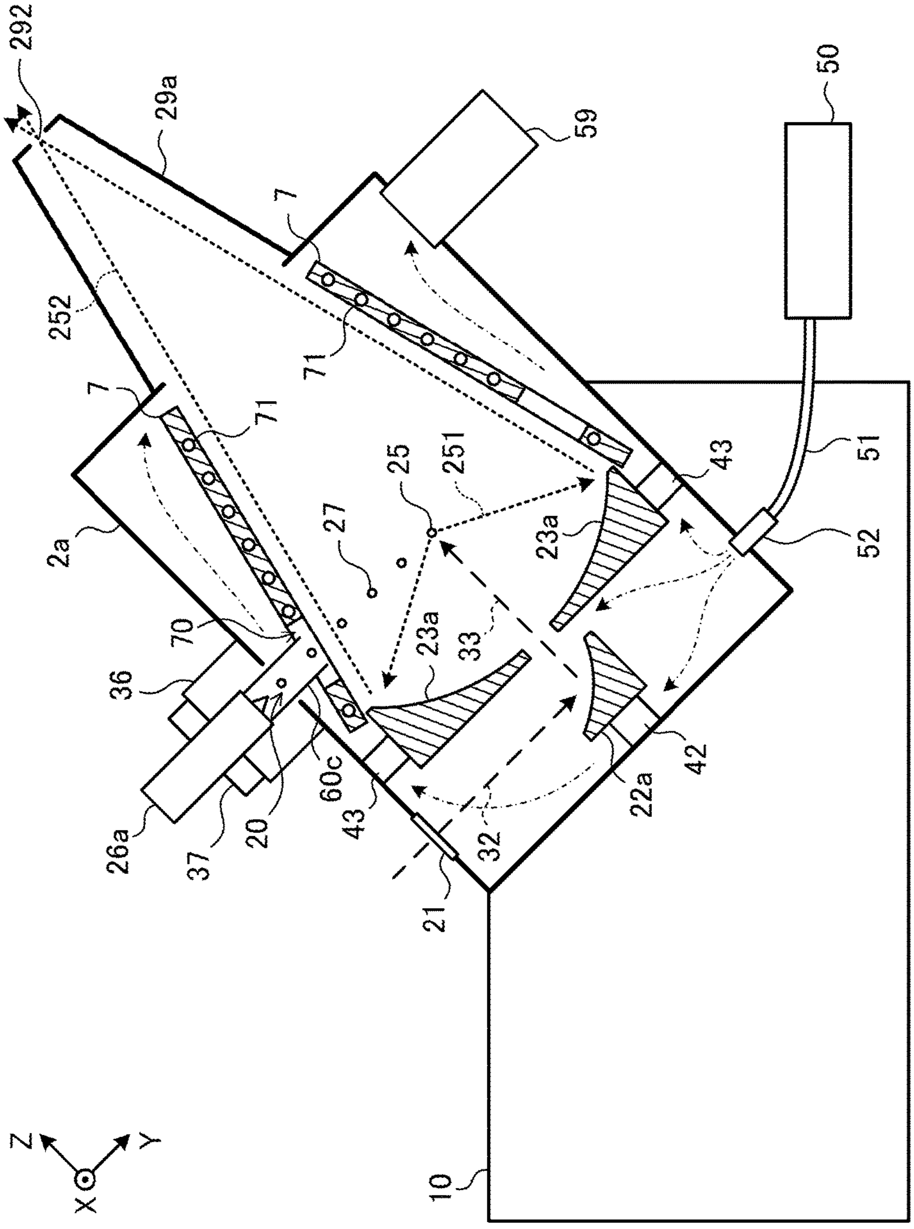
FIG. 8 schematically shows a configuration of an EUV light generation device according to a third embodiment of the present disclosure.

6. EUV Light Generation Device where Tubular Member is Fixed to Target Supply Unit FIG. 8 schematically shows a configuration of an EUV light generation device according to a third embodiment of the present disclosure. As shown in FIG. 8, a tubular member 60*c* may be fixed to the target supply unit 26*c*. The tubular member 60*c* may not be fixed to the chamber 2*a*. The tubular member 60*c* may have a diameter smaller than that of the through-hole 20 of the chamber 2*a*, and the tubular member 60*c* and the chamber 2*a* may have a gap between them. The tubular member 60*c* may not necessarily have the flange portion 61 described above with reference to FIGS. 5A and 5B.

According to the third embodiment, since the tubular member 60*c* is fixed to the target supply unit 26*a*, the tubular member 60*c* may move with the target supply unit 26*a*, by the XZ stage 37. Accordingly, even if the target supply unit 26*a*, moves, the position of the actual path of the target relative to the tubular member 60*c* may be suppressed to fluctuate. Thus, even if the target supply unit 26*a*, moves, the target may be suppressed to adhere to the tubular member 60*c*.

In other aspects, the third embodiment may be substantially the same as the second embodiment.

Figure 9:
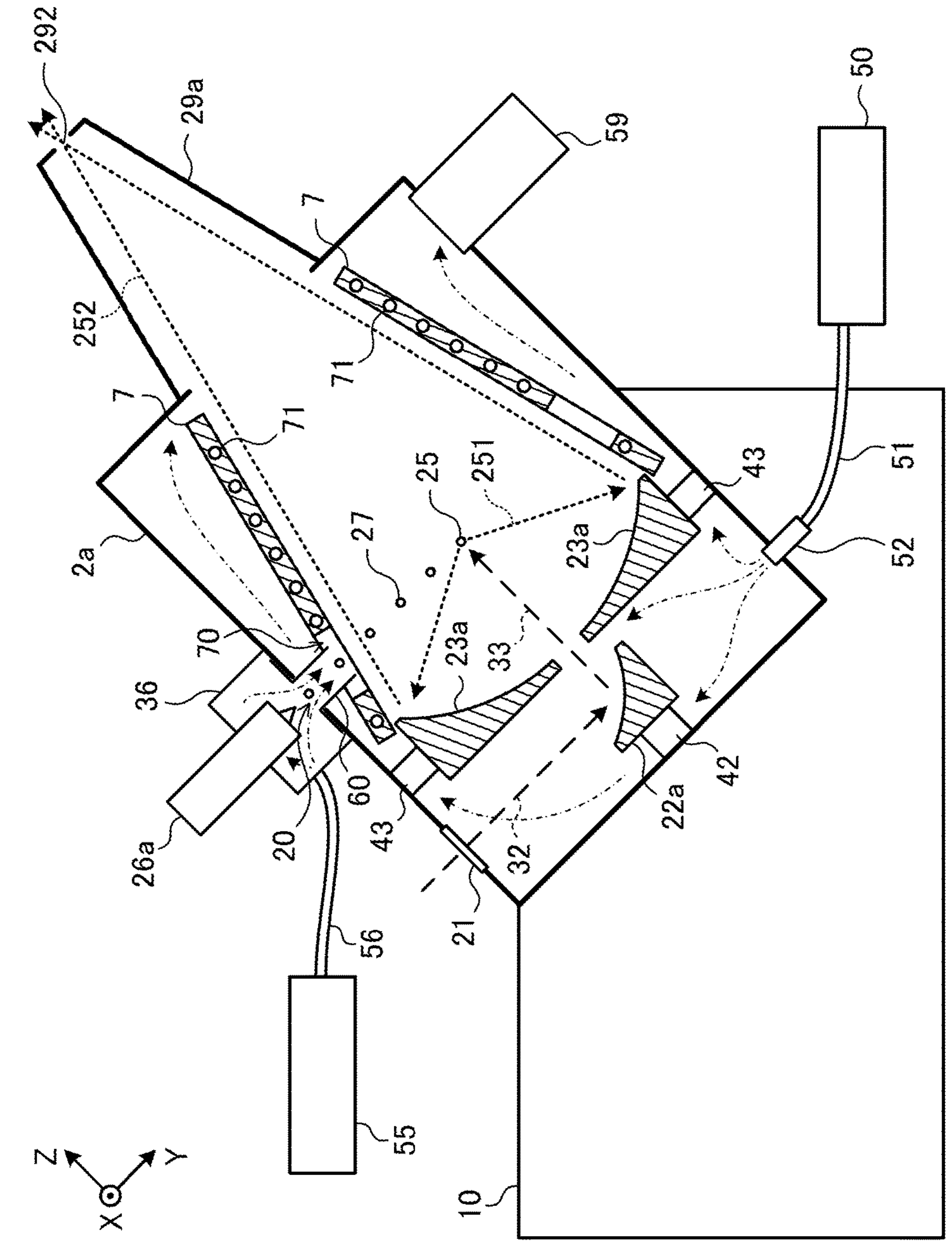
FIG. 9 schematically shows a configuration of an EUV light generation device according to a fourth embodiment of the present disclosure.

7. EUV light generation device Where Purge Gas is supplied to Inside of Tubular Member FIG. 9 schematically shows a configuration of an EUV light generation device according to a fourth embodiment of the present disclosure. As shown in FIG. 9, the fourth embodiment may include a purge gas supply device 55. The purge gas supply device 55 may include an unillustrated gas cylinder containing purge gas and an unillustrated mass flow controller or on-off valve. The purge gas may include inert gas such as helium gas, nitrogen gas, or argon gas. The purge gas may include hydrogen gas or halogen gas. The purge gas may be etching gas. The purge gas supply device 55 may be connected to a pipe 56. The pipe 56 may be connected to the holding unit 36, which holds the target supply unit 26*c*.

The purge gas supply device 55 may supply the purge gas to a space inside the holding unit 36. The purge gas supplied to the holding unit 36 may flow to a space inside the tubular member 60. The gas pressure in the holding unit 36 may be slightly higher than that in the chamber 2*a*. Gas flow of the purge gas may thus be generated in the tubular member 60 from the first end described above, via the second end described above, into a space inside the shield member 7.

According to the fourth embodiment, even if unstable gas flow is generated in the space inside the shield member 7, the gas flow may be suppressed to go into the tubular member 60. Further, a substantially constant flow rate of the purge gas supplied by the purge gas supply device 55 may achieve a substantially constant flow rate of the purge gas in the tibular member 60 from the first end described above to the second end described above. The actual path of the target may thus be further stabilized.

In other aspects, the fourth embodiment may be substantially the same as the first embodiment.

Figure 10:
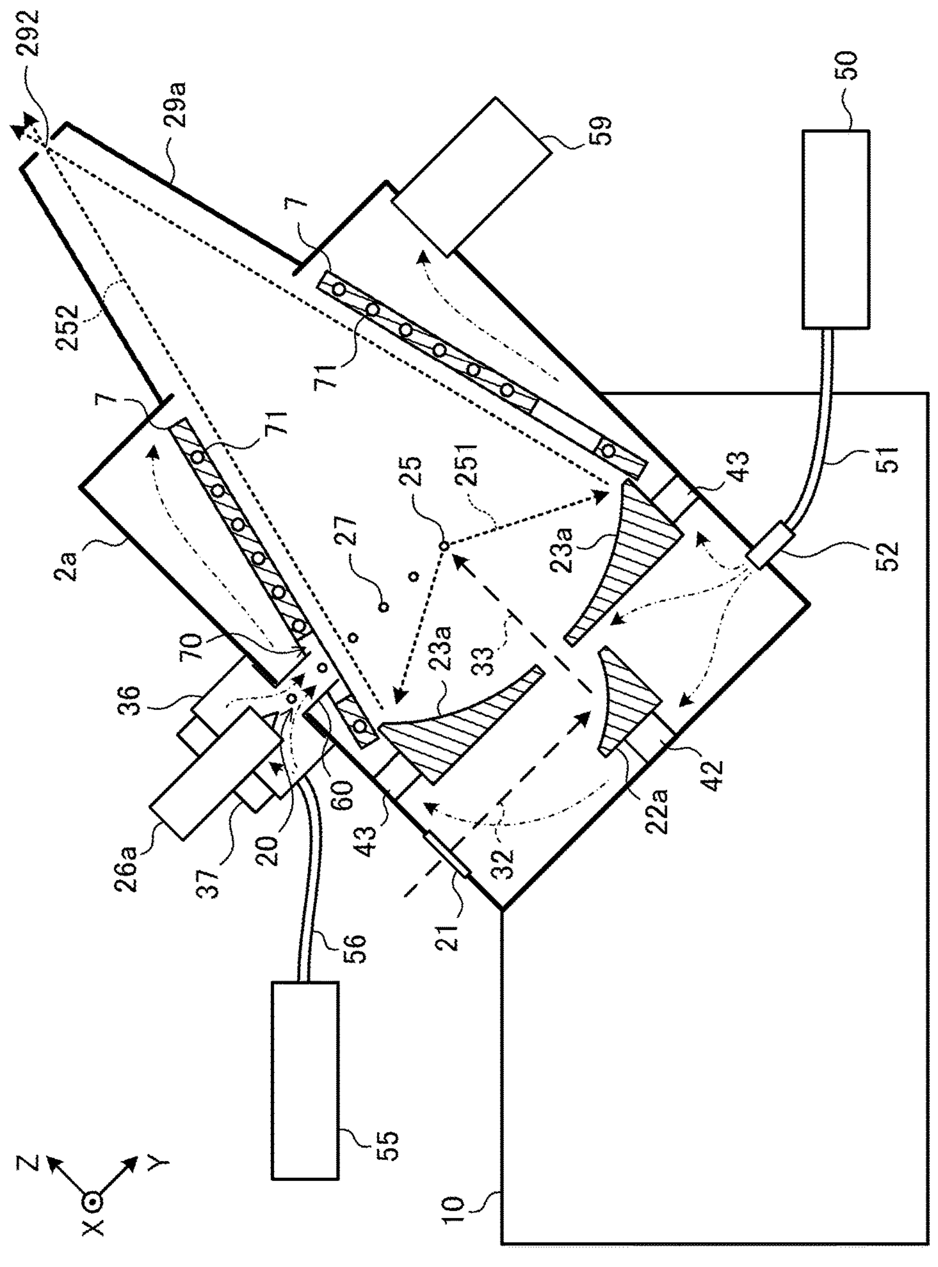
FIG. 10 schematically shows a configuration of an EUV light generation device according to a fifth embodiment of the present disclosure.

FIG. 10 schematically shows a configuration of an EUV light generation device according to a fifth embodiment of the present disclosure. As shown in FIG. 10, the fifth embodiment may have the configuration of the second embodiment including the XZ stage 37 and further have a purge gas supply device 55. The configuration and the effect of the purge gas supply device 55 may be substantially the same as that described with reference to FIG. 9.

In other aspects, the fifth embodiment may be substantially the same as the second or third embodiment. In a situation where the tubular member 60*c* is fixed to the target supply unit 26*a*, as described in the third embodiment, an unillustrated flexible pipe may be connected to the tubular member 60*c* to supply the purge gas to a space inside the tubular member 60*c*.

Figure 11:
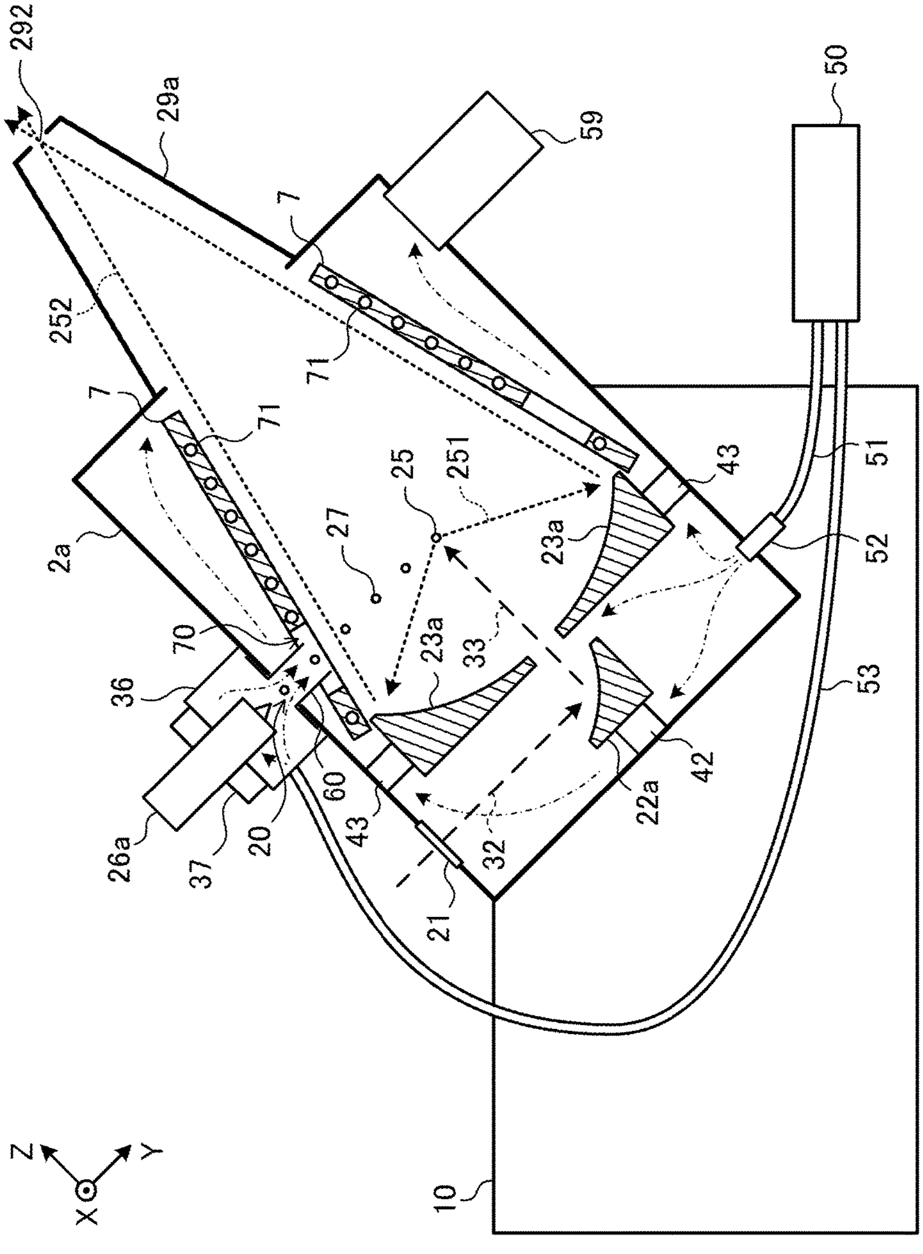
FIG. 11 schematically shows a configuration of an EUV light generation device according to a sixth embodiment of the present disclosure.

8. EUV light generation device Where Etching Gas is supplied to Inside of Tubular Member FIG. 11 schematically shows a configuration of an EUV light generation device according to a sixth embodiment of the present disclosure. As shown in FIG. 11, in the sixth embodiment, a pipe 53 connected to the etching gas supply device 50 may be connected to the holding unit 36.

Thus, in the sixth embodiment, the etching gas in place of the purge gas may be supplied to the space inside the holding unit 36 and to the space inside the tubular member 60.

In other aspects, the sixth embodiment may be substantially the same as the fourth or fifth embodiment.

The above descriptions are intended to be only illustrative rather than being limiting. Accordingly, it will be clear to those skilled in the art that various changes may be made to the embodiments of the present disclosure without departing from the scope of the appended claims.

The terms used in the present specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in the present specification and the appended claims should be interpreted as meaning "at least one" or "one or more".

The invention claimed is:

1. An extreme ultraviolet light generation device comprising:

- a chamber having a first through-hole that allows a pulse laser beam to enter the chamber;
- a target supply unit held by the chamber and configured to output a droplet target toward a predetermined region in the chamber;
- a collector mirror configured to reflect and collect the extreme ultraviolet light generated in the predetermined region;
- a shield member surrounding the predetermined region in the chamber, the shield member surrounding an optical path of the extreme ultraviolet light reflected by the collector mirror and having a target path that allows the droplet target outputted from the target supply unit to pass toward the predetermined region; and
- a tubular member surrounding at least a part of an upstream portion of the trajectory of the droplet target outputted from the target supply unit toward the predetermined region, the upstream portion being upstream from the target path of the shield member.

2. The extreme ultraviolet light generation device according to claim 1, further comprising:

a gas supply device configured to supply gas to a space inside the chamber and outside the shield member.

3. The extreme ultraviolet light generation device according to claim 1, further comprising:

a gas supply device configured to supply gas to a space inside the tubular member.

4. The extreme ultraviolet light generation device according to claim 1, wherein the tubular member is fixed to the target supply unit with a gap between the tubular member and the shield member.

5. The extreme ultraviolet light generation device according to claim 1, wherein the tubular member is provided at outside of the optical path of the extreme ultraviolet light reflected by the collector mirror.

6. The extreme ultraviolet light generation device according to claim 1, wherein the tubular member has a cylindrical shape having a circular section perpendicular to the trajectory of the droplet target outputted from the target supply unit.

7. The extreme ultraviolet light generation device according to claim 1, wherein the tubular member has a quadrangle piped shape having a quadrangle section perpendicular to the trajectory of the droplet target outputted from the target supply unit.

8. An extreme ultraviolet light generation device comprising:

a chamber having a first through-hole that allows a pulse laser beam to enter the chamber;

a target supply unit held by the chamber and configured to output a droplet target toward a predetermined region in the chamber;

a shield member surrounding the predetermined region in the chamber and having a target path that allows the droplet target outputted from the target supply unit to pass toward the predetermined region; and a tubular member surrounding at least a part of an upstream portion of the trajectory of the droplet target outputted from the target supply unit toward the predetermined region, the upstream portion being upstream from the target path of the shield member, the tubular member being fixed to the chamber with a gap between the tubular member and the shield member.

9. The extreme ultraviolet light generation device according to claim 8, wherein the tubular member penetrates a through-hole of the shield member, the through-hole constituting the target path.

10. The extreme ultraviolet light generation device according to claim 8, wherein the tubular member has a flange portion located at the outside of the chamber.

11. An extreme ultraviolet light generation device comprising:

a chamber having a first through-hole that allows a pulse laser beam to enter the chamber;

a target supply unit held by the chamber and configured to output a droplet target toward a predetermined region in the chamber;

a shield member surrounding the predetermined region in the chamber and having a target path that allows the droplet target outputted from the target supply unit to pass toward the predetermined region;

a tubular member surrounding at least a part of an upstream portion of the trajectory of the droplet target outputted from the target supply unit toward the predetermined region, the upstream portion being upstream from the target path of the shield member; and a trajectory adjusting mechanism configured to adjust a trajectory of the droplet target in a first direction substantially perpendicular to the trajectory and in a second direction substantially perpendicular to both of the trajectory and the first direction, wherein the tubular member has a rectangular section, the rectangular section having first and third edges substantially parallel to the first direction and second and fourth edges substantially parallel to the second direction.

* * * * *